United States Patent [19]

Maron

[11] Patent Number: 4,501,650
[45] Date of Patent: Feb. 26, 1985

[54] WORKPIECE CLAMP ASSEMBLY FOR ELECTROLYTIC PLATING MACHINE

[75] Inventor: Leonard C. Maron, Bristol, Conn.

[73] Assignee: Napco, Inc., Terryville, Conn.

[21] Appl. No.: 526,981

[22] Filed: Aug. 26, 1983

[51] Int. Cl.³ .................... C25D 17/06; C25D 17/04
[52] U.S. Cl. .................................... 204/198; 204/202; 204/297 R
[58] Field of Search ................. 204/198, 202, 297 R

[56] References Cited

U.S. PATENT DOCUMENTS

| | | | |
|---|---|---|---|
| 2,101,178 | 12/1937 | Hogaboom et al. | 204/203 |
| 2,299,618 | 10/1942 | Finston | 204/17 |
| 2,651,614 | 9/1953 | Bungay | 204/197 |
| 4,032,414 | 6/1977 | Helder et al. | 204/15 |
| 4,377,461 | 3/1983 | Lovejoy | 204/198 |
| 4,405,431 | 9/1983 | Pfeifer et al. | 204/297 R X |

FOREIGN PATENT DOCUMENTS 0157740 12/1979 Japan ............................ 204/15

Primary Examiner—Donald R. Valentine
Attorney, Agent, or Firm—McCormick, Paulding & Huber

[57] ABSTRACT

In a plating machine the circuit board workpieces are held in clamp assemblies which grip the leading edge of each board so that the lower edges of the boards can be plated as the clamps travel around the machine. These clamps are adjustably mounted on a chain, and can be quickly removed for varying the spacing between them. Each clamp is designed to be loaded by the machine operator in a one handed operation without any separate clamp opening motion by him.

12 Claims, 13 Drawing Figures

WORKPIECE CLAMP ASSEMBLY FOR ELECTROLYTIC PLATING MACHINE

This invention relates generally to electroplating machines of the type adapted to plate the tabs generally provided along a lower marginal edge of generally rectangular workpieces such as printed circuit boards. More particularly, this invention relates to a unique clamping assembly for supporting the circuit boards as they travel in a closed path around a machine of the return type having a load/unload station at one end and having parallel runs connected to one another by semicircular end turns.

U.S. Pat. No. 4,377,461 shows and describes a tab plater of the this general type, and this prior art patent is incorporated by reference herein for purposes of describing the various rinsing and plating tanks required to treat and to plate the circuit boards as they are transported around a closed path. An endless chain moves the circuit boards so that each board is conveyed horizontally and longitudinally in its own plane through treating and plating stations provided above tanks or reservoirs containing solutions to carry out the various steps required in stripping, nickel plating, and gold plating as well as intermediate washing and drying steps associated with plating of the tabs on a typical circuit board. Plating heads are provided in the path of the lower marginal edges of the boards, and each head includes an upwardly open chamber through which the workpieces are adapted to move. Longitudinally extending insoluble electrodes are provided on either side of the plating head chamber, and these electrodes are generally recessed in the chamber sidewalls. Fluid filled plenums store a quantity of the electrolyte under pressure and are located behind these chamber sidewalls with pumping means serving to maintain these plenums in this condition. Nozzle openings in the chamber sidewalls provide the electrolyte under pressure and serve to spray the electrolyte on the area to be plated. The upwardly open chamber fills with an agitated electrolytic fluid to the desired level with the overflow or return openings provided above the insoluble anode openings in the chamber sidewalls. End walls for the plating head are defined by inwardly projecting rubber dams which are normally closed against one another, but which will be moved apart in response to motion of the circuit boards therebetween.

In the prior art patent referred to previously the transport conveyor comprises a single chain supported in the frame superstructure and movable in a closed path with trolleys mounted to spaced locations on the chain and with a trolley track adjacent to the chain for guiding the trolley during its motion. The present invention represents an improvement over this configuration wherein a single chain is still utilized, and wherein a track is provided adjacent to the chain and parallel to the longitudinally extending straight runs of the chain through the above mentioned electroplating and rinsing and other treating stations. The workpiece holders of the prior art patent are supported on trolleys such that a vertically oriented work arm is adapted to support the circuit boards adjustable in relation to the arm by means of a clamping bracket adapted to secure the upper marginal edge of the workpiece to the trolley for passage to the various stations.

SUMMARY OF INVENTION

The present invention provides an improved clamping assembly which is adapted to grip the leading edge of the board as it moves through these stations, and the board is easily inserted into the clamp assembly either by hand or in an automated fashion so as to permit circuit boards of various heights to be handled in the machine without necessity for adjusting the workpiece holder as was true of the above mentioned prior art patent.

Another advantage of the present invention resides in the fact that the clamp assemblies can be adjustably mounted to the transport conveyor chain at a desired pitch, that is the operator can remove and replace these clamp assemblies as a result of a unique transport assembly to be described, with the result that circuit boards of various width can be accommodated in the machine with a minimum of down time to alter or setup the machine to accommodate circuit boards of different configuration.

Still another advantage of the present invention can be attributed to the ease with which the clamp assembly can be disassembled for replacement or repair.

In accordance with the present invention a plating machine is provided having a lower base portion with capability for providing the various rinsing and plating stations required to treat circuit boards in the manner suggested above, and more particularly to receive the lower marginal edges of these flat planar workpieces so that tabs defined in the boards can be gold plated. The machine frame includes an elongated superstructure spaced above the base and housing a workpiece transport conveyor comprising a chain with two sprockets supported in opposite ends of the superstructure so that the chain moves in a closed path defined by generally parallel straight runs for transporting the circuit boards through the various plating tanks or stations, and having semi-circular end turns for reversing the direction of the boards and for returning the boards to a load/unload station. The load/unload station may comprise a single station, or in an automated version may comprise closely spaced stations located adjacent to one end of the machine. Elongated tracks are supported in the superstructure adjacent to and parallel these straight chain runs, and workpiece clamping assemblies are slidably received on these tracks. Each clamp assembly includes a movable clamping portion and a base portion which is adapted to slidably receive the track. Coupling means is provided for connecting each base portion to a desired location on the chain, and the chain is of conventional configuration having individual roller links conventionally connected to one another. Each roller link has two rollers supported on vertically extending pins and at least some of these pins have projecting portions which extend downwardly so as to be received in pin openings provided for this purpose in the clamp assembly base portion. Semi-circular clamp base support shelves are located below each of the sprockets at the ends of the superstructure, and at least one such shelf is adapted to be readily removed from its active position in the machine structure frame wherein it is adapted to support the clamping assemblies conveyed around the sprocket. When this shelf is removed or swung to an inactive position these clamp assemblies can be readily removed or replaced to vary the spacing between them or for other reasons.

Each clamp assembly includes a slide block defining a channel for receiving its associated track, and a clamp body is removably secured to the slide block by a bayonet type connection which permits removal of the clamp body from the slide block without requiring the use of tools. Thus, the machine operator is able to change over from one circuit board size setup to another without necessarily having to remove the shelf referred to previously.

Each clamp assembly includes a lever portion pivotally mounted in the clamp body and a vertically elongated roller member coupled to the said lever for movement toward and away from a vertically elongated workpiece edge guide surface defined by the clamp body. Biasing means urges the roller member toward a ramp or inclined ramp plate in the clamp body so as to urge the roller member into contact with the circuit board and consequently to hold this circuit board against the above mentioned guide surface.

DETAILED DESCRIPTION

As mentioned in U.S. Pat. No. 4,377,461 circuit boards including the tabs are generally covered with a tin-lead or solder which first must be removed so that nickel can be applied in thicknesses of approximately 0.0002 inches and gold to a thickness of approximately 0.00005 inches. The standard for gold plating of the tabs will not permit any solder or other contaminants to interfere with the nickel and gold plating in the area where connections are to be made to these circuit boards, and since only the tab portion need be gold plated according to present practice the boards are generally masked so that solder is stripped along a definite line of demarcation known as the mask line so that the nickel and gold can be plated after the solder material is removed. In a typical plating machine such as that shown and described in the above mentioned patent the circuit boards are adapted to be loaded adjacent one end of the machine and to traverse a closed path travelling on holders or clamped in clamp assemblies under the control of a conveyor to be described so that these boards or workpieces move first through the solder stripping tank where previously plated solder material is stripped away from the lower marginal edges of the boards to expose the previously copper plated electrical connecting tab portions of the board. These boards travel in a horizontal path around the machine without necessity for raising and lowering the boards and without necessity for opposed belts to drive the boards around this closed path. The boards are subjected to a series of rinsing and scrubbing operations to assure that the solder and other impurities are removed from the surfaces to be nickel plated and the nickel plate is applied prior to the application of the final gold plate. The plating heads for accomplishing both the nickel and gold plating may be as described in the above mentioned patent or, alternatively and as shown and described herein the workpiece or circuit board clamping assemblies do not include means for applying electrical potential to the boards, rather the boards are connected to a suitable source of electric potential by brush type bristle contact elements as indicated generally at 10 and 12 in FIG. 2.

Figure 1:
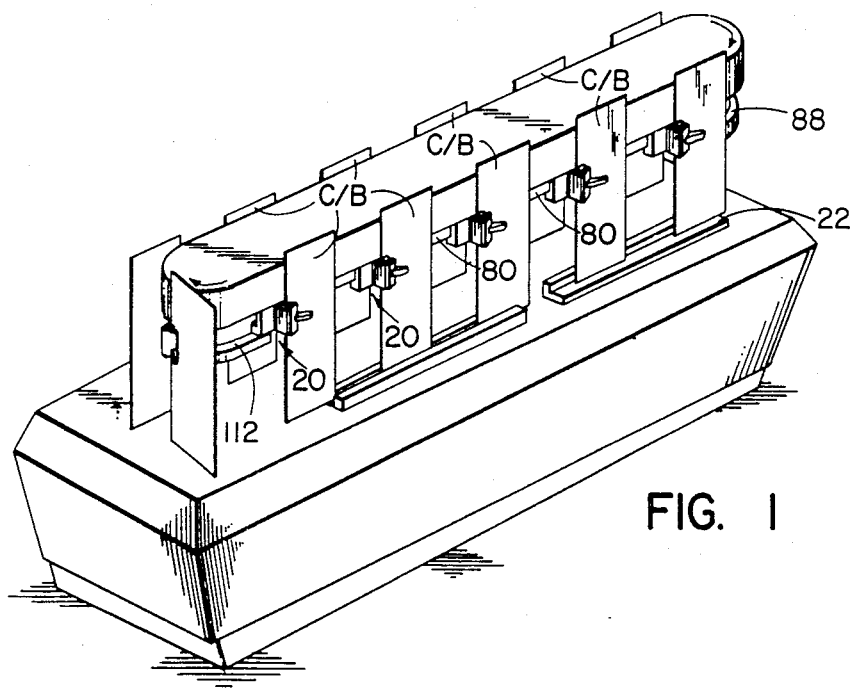
FIG. 1 is a perspective view of an electroplating machine equipped with clamp assemblies of the present invention.

FIG. 1 shows the overall configuration of a typical plating machine constructed in accordance with the present invention and capable of handling circuit boards loaded at the load/unload station adjacent one end of the machine. The machine shown is capable of moving the boards from this load/unload station through a stripping station where the lead solder coating applied to protect the copper conductors in the board is removed. The boards then move through a short rinsing station and a scrubber station removes excess material from the lower marginal edge portions of the board which are to be plated on the backside of the machine. A rinse station rinses the boards following which they travel around a 180 degree semi-circular track for return movement through an acid and rinse station following which nickel plate is applied to the tabs defined in the lower marginal edge of the board. Another rinse station is applied following the nickel plate step and an acid station prepares the boards for gold plating. The acid is removed at a rinse station intermediate the acid and gold plating station and after the gold plate has been applied excess electrolyte on the board is reclaimed following which the board is rinsed and passed through a moisture removal station comprising a roller assembly and a dryer. The boards then pass around the opposite end portion of the machine to the load/unload station or are removed prior to this turn in an automated version of this machine currently under development.

Figure 2:
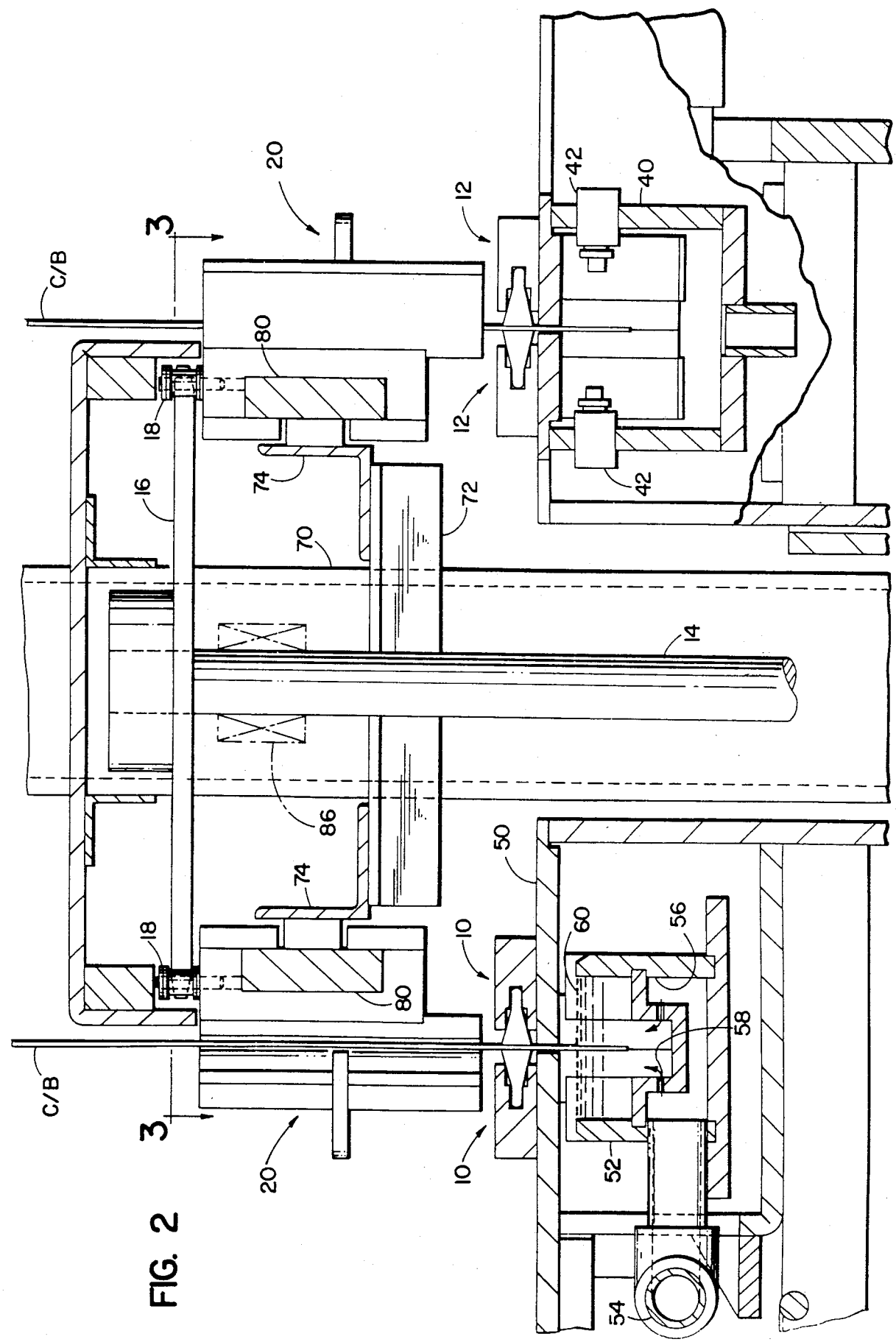
FIG. 2 is a vertical section through the electroplating machine of FIG. 1 and illustrates the circuit boards moving along the parallel straight runs of the conveyor chain, the left-hand board moving away from the viewer and the right-hand board moving toward the viewer.

The machine has a frame comprising a base in which the various electroplating and rinse tanks are supported, and as best shown in FIG. 2 the machine frame includes a superstructure housing a drive shaft 14 which turns a driven sprocket 16 and operates an endless conveyor chain 18, which chain comprises part of a transport conveyor system to transport the circuit board workpieces around the closed path referred to in the preceding paragraph.

Each board is clamped in a circuit board clamp assembly indicated generally at 20 and it is important to provide each workpiece in a predetermined position with respect to the plating and rinsing tank so that only the desired lower marginal edge portion of the board is subject to the various process steps referred to previously. A horizontally extending shelf 22 (FIG. 5) is provided at the load/unload station for locating each board as it is manually inserted into the clamp assembly 20 as the clamp assembly is moving through this station.

As shown in FIG. 2, and more particularly at the right-hand side of FIG. 2 the stripping station includes electrode means 12 for applying a predetermined electrical potential to the boards as they are subjected to the stripping process in the stripping tank 40. The stripping solution is circulated through a drain provided in the lower wall of the reservoir tank 40 and is returned to the tank 40 through nozzles 42, 42.

As shown at the left-hand side of FIG. 2 the circuit board C/B is moved by means of clamp assembly 20 through a plating station wherein electrode means 10 apply the desired electric potential to the circuit board lower portion as this lower portion passes through an electrolytic fluid circulated through the active portion 52 of a tank 50 containing the electrolyte. This electrolyte is circulated through this active portion 52 by pumping means (not shown) and is returned from a reservoir (not shown) through piping 54 to a plenum 56 where the fluid moves through ports 58 into the active portion 52 of the plating tank until reaching the level indicated generally at 60 whereupon the fluid passes over the dam-like side walls of the active portion 52 of the tank to be returned to the reservoir for rejuvenation and recirculation.

Still with reference to FIG. 2, the machine frame has vertical uprights 70, 70 which are supported by the base of the frame and which in turn support the superstructure for housing a circuit board transport conveyor to be described. Cross members 72 are secured to these uprights 70 and these cross arms in turn support longitudinally extending L-shaped beams 74, 74. The beams 74, 74 in turn support longitudinally extending tracks or rails 80, 80 defining the generally straight parallel runs upon which the clamp assemblies 20, 20 ride as a result of movement imparted to these clamp assemblies by the chain 18.

Figure 3:
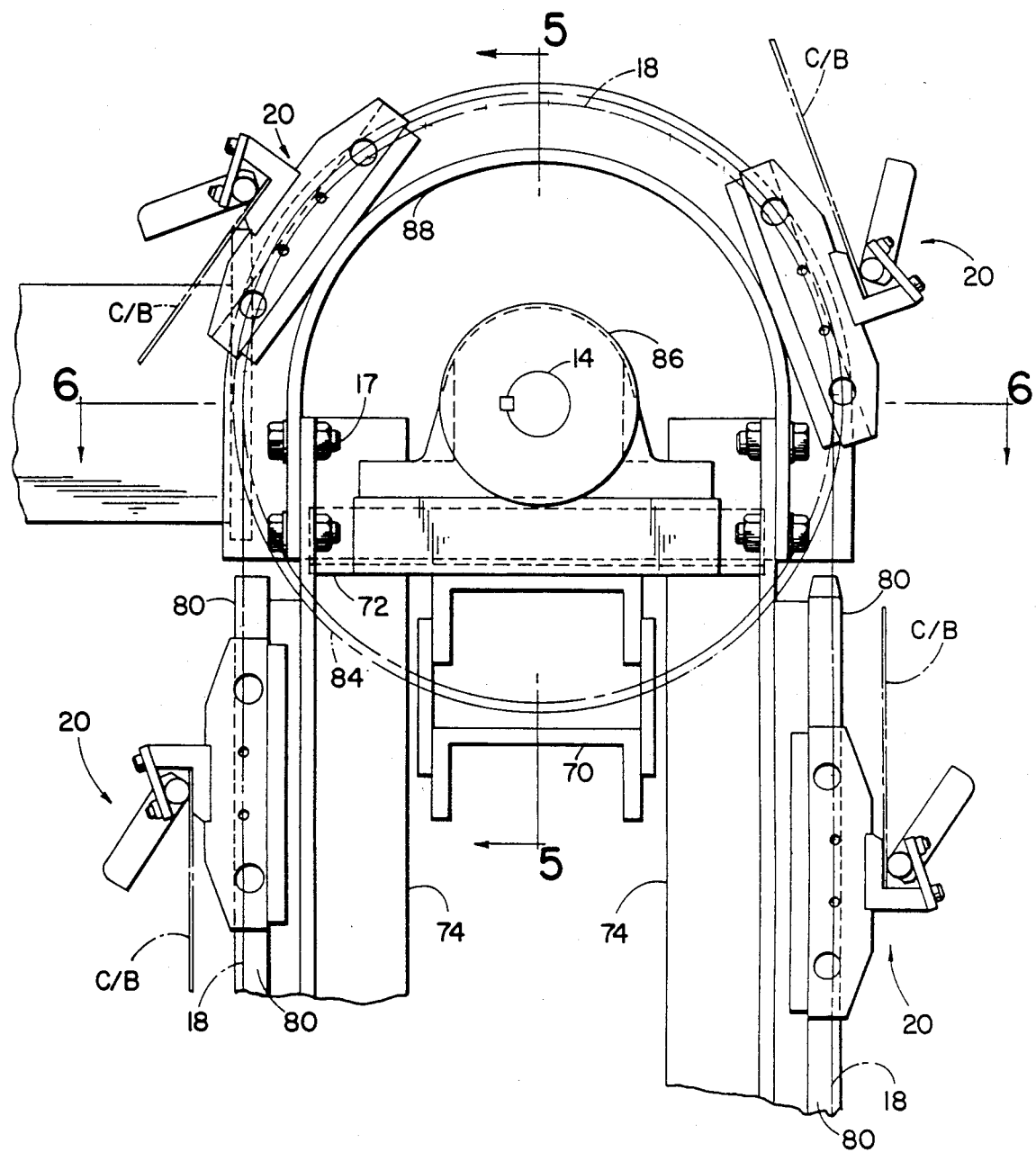
FIG. 3 is a horizontal sectional view being taken generally on the line 3—3 of FIG. 2, and illustrating the semi-circular end turn for the transport conveyor system at one end of the machine.

As best shown in FIG. 3 the chain 18 moves, at least along its generally parallel straight runs, just above and parallel to the rails or tracks 80, 80 which slidably support the clamp assemblies as illustrated in FIG. 1. FIG. 3 shows the drive sprocket 84 which moves the chain 18 as a result of being keyed to the upper end of drive shaft 14 supported for rotation in the journal bearing 86.

Figure 4:
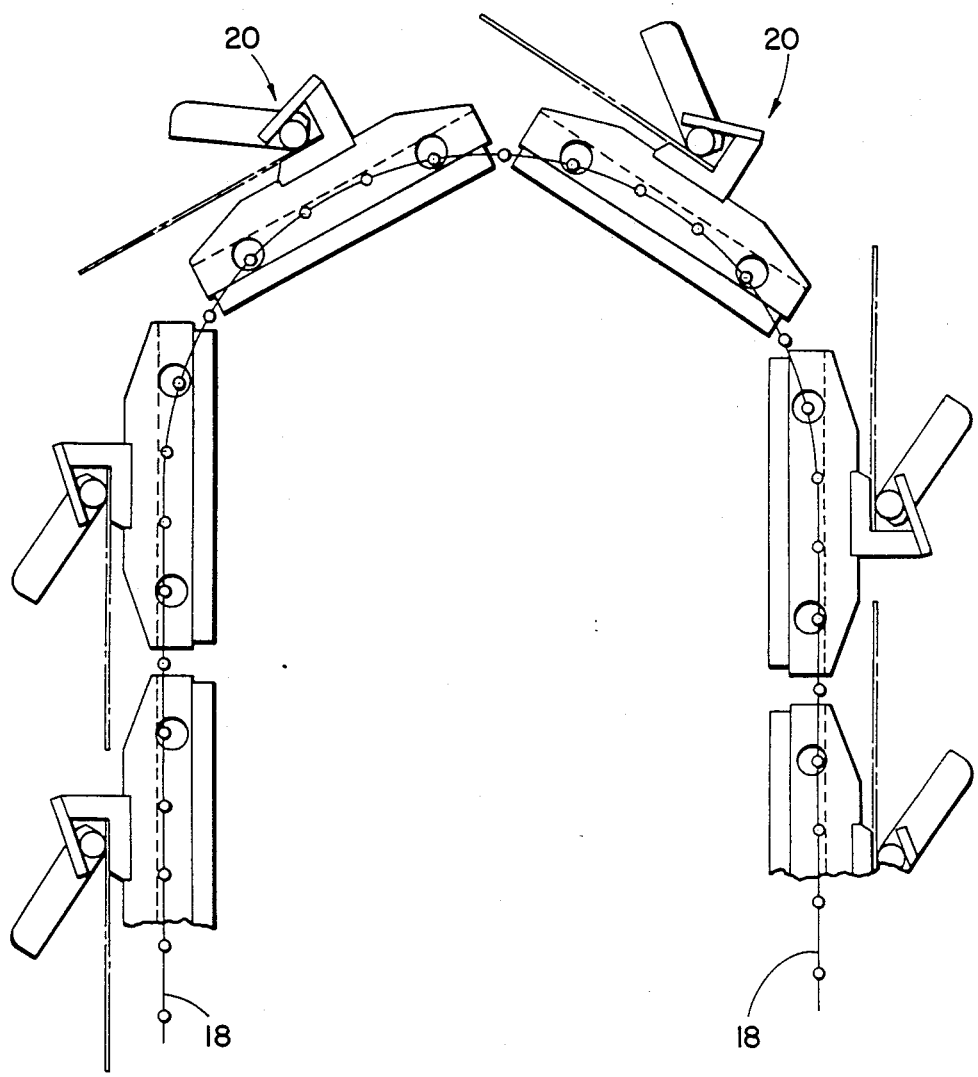
FIG. 4 illustrates the setup for a machine of the type shown in FIGS. 1-3 wherein relatively small circuit boards are adapted to be handled, that is with a closer spacing between the adjacent clamp assemblies on the conveyor chain.
Figure 5:
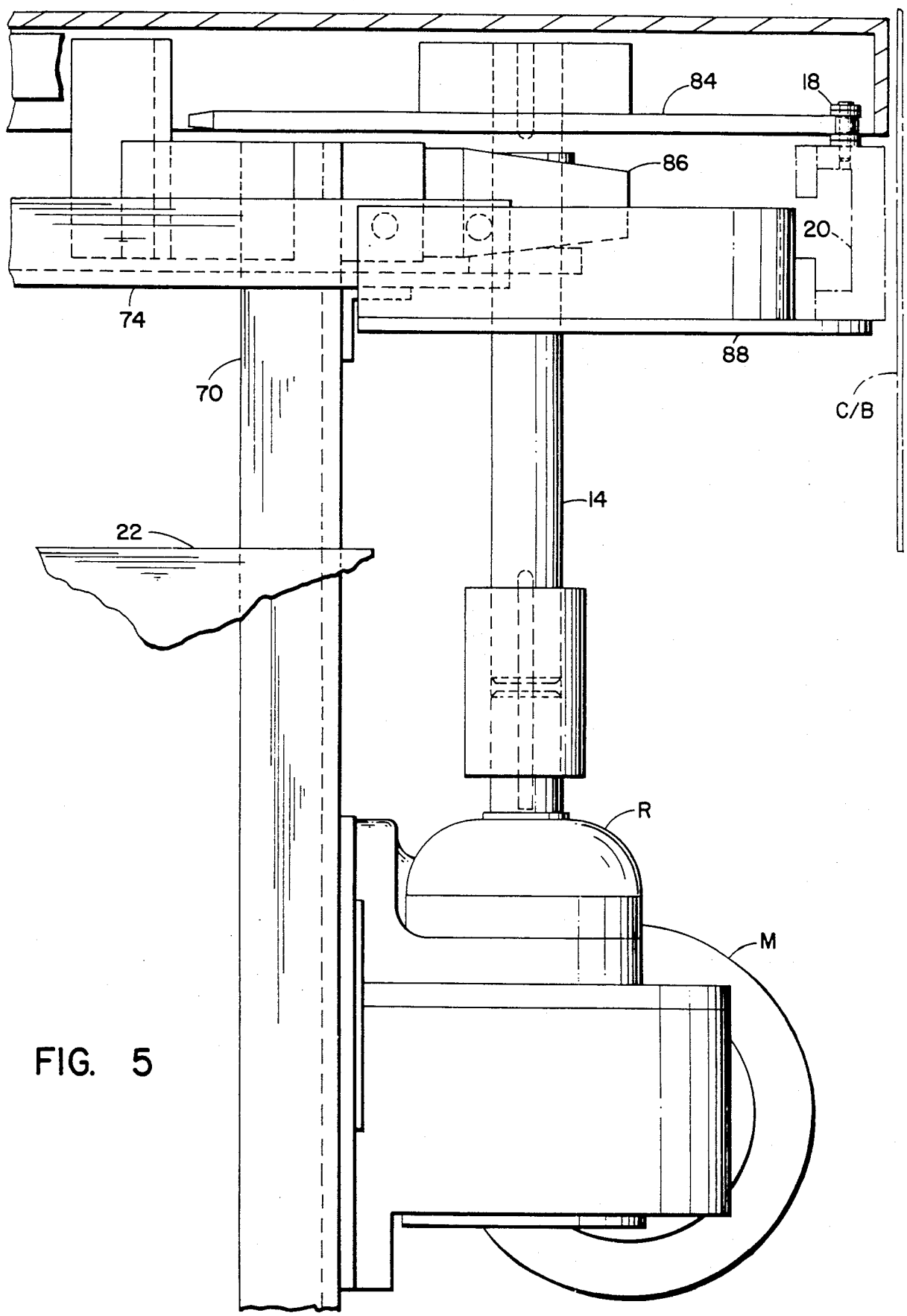
FIG. 5 is a vertical section taken generally on the line 5—5 of FIG. 3.

It is an important feature of the present invention that the it permits pitch or spacing between the circuit board clamp assemblies 20, 20 be conveniently adjusted for handling circuit boards of different width, and FIG. 4 illustrates a relatively close spacing for clamp assemblies 20, 20 suitable for handling relatively narrow circuit board workpieces. Means is provided for conveniently removing the clamp assemblies 20, 20 from the chain 18 and this is accomplished at one end of the machine, preferably, that end adjacent to the load/unload station. FIG. 3 illustrates the driven end of the machine, and it will be apparent that the clamp assemblies 20, 20 are carried around this 180 degree semicircular turn by the chain 18 traveling around the sprocket 84. However, since the clamp assemblies are not supported on the longitudinally extending rails 80, 80 as they travel around the sprocket 84 a U-shaped track 88 is provided to slidably support the lower edges of each clamp assembly 20 as it is carried off the end of track 80 under the influence of the chain 18. This track 88 is fixed to the ends of beams 74, 74 by rivets 17, 17. The clamp assemblies 20, 20 are carried around the drive sprocket 84 by the chain 18 as a result of coupling means provided between the chain 18 and an upper marginal edge portion of each clamp assembly. Each coupling will be described in greater detail hereinafter. FIG. 5, shows, for reference purposes the relative height for a fixed guide surface 22 at the load station, which surface is utilized by the machine operator in loading circuit boards into the clamp assemblies 20, 20. FIG. 5 also illustrates the motor M for driving the shaft 14 through a speed reducing unit R.

Figure 6:
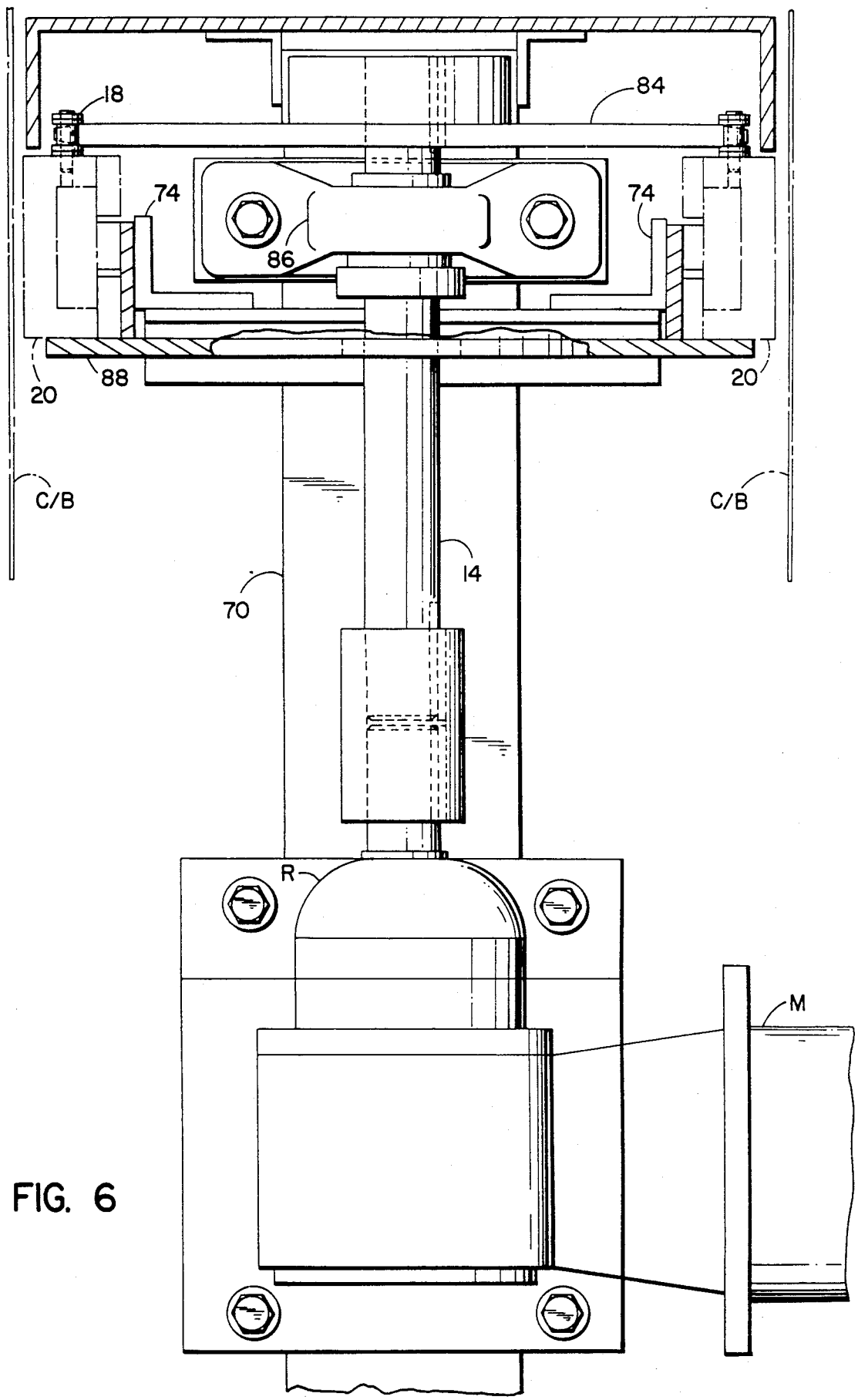
FIG. 6 is a vertical section taken generally on the lines 6—6 of FIG. 3.

FIG. 6 is a vertical section taken on the line 6—6 of FIG. 3 and illustrates the driven sprocket 84 and its journal bearing 86 together with the chain 18 for moving the clamp assemblies 20 around the associated end of the machine. Each clamp assembly 20 is supported on a horizontally extending shelf 88 defined by the U-shaped track referred to previously.

Figure 7:
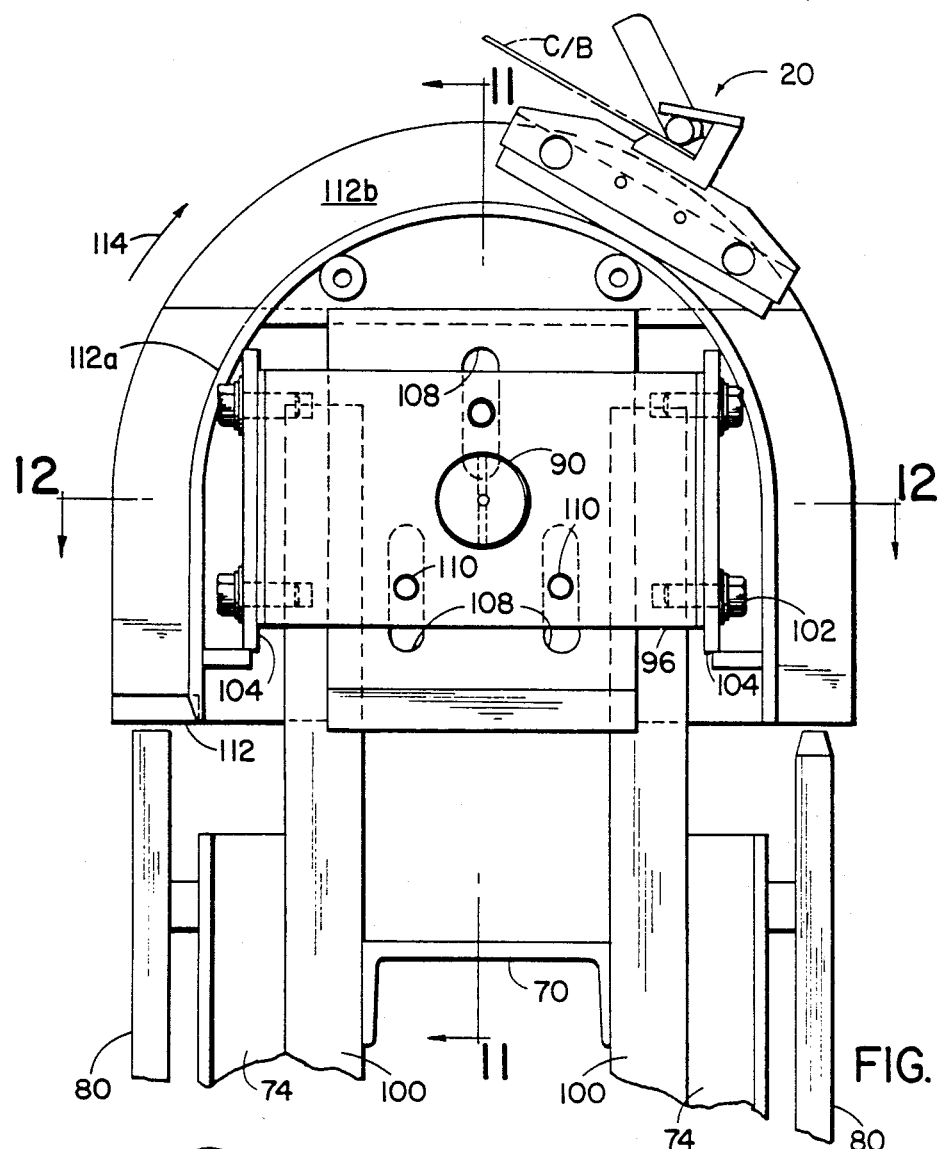
FIG. 7 is a view similar to FIG. 3 but illustrating the opposite end of the machine with its associated semi-circular end turn.
Figure 11:
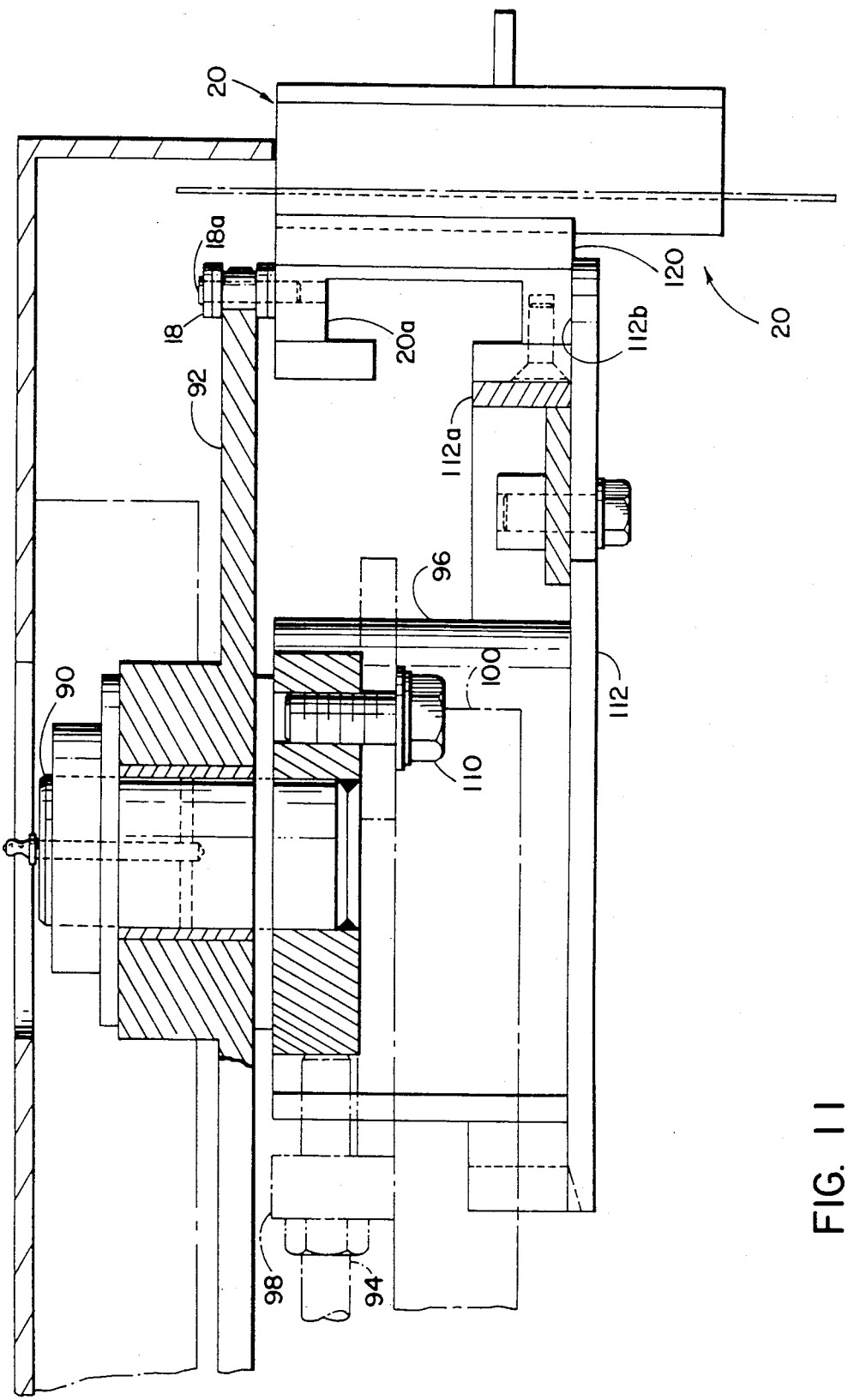
FIG. 11 is a vertical section taken generally on the line 11—11 of FIG. 7.

Turning next to FIG. 7 the opposite end of the machine is there shown where an idler sprocket (omitted for clarity) is supported for rotation on a vertical stub shaft 90. FIG. 11 shows this shaft 90 as supporting idler sprocket 92 and chain 18. The shaft 90 is adapted to be adjusted longitudinally of the machine by adjusting screws 94 which serve to move the sprocket supporting structure 96 longitudinally in order to tension the chain 18. These adjusting screws 94 are threadably received in lugs 98 defined for this purpose on longitudinally extending rails 100, 100 which rails comprise a portion of the fixed frame for the machine. FIG. 7 shows these rails secured to at least one of the vertical uprights 70 referred to previously. The sprocket support structure 96 and the sprocket 92 and the idler sprocket shaft 90 are also adjustable, at least to a limited extent, in a direction transverse to the longitudinal direction and screws 102 are provided in upstanding web portions 104, 104 of the sprocket support structure 96 for this purpose. The slotted openings 108, 108 slidably receive vertically extending screws such as shown at 110 in FIG. 11 and permit the support 96 for the idler sprocket 92 to be adjusted in the longitudinal direction as a result of the adjusting screws 94, 94.

The idler sprocket end of the machine illustrated in FIG. 7 is similar to the driven sprocket end illustrated in FIG. 3 to the extent that a U-shaped shelf 112 is provided for supporting the clamp assemblies as they move around the idler sprocket on the chain 18 from one longitudinally extending track rail 80 to the other. The direction of motion for these clamp assemblies is illustrated in FIG. 7 at 114, and although the chain is not shown it will be apparent that it is above and parallel to the rails 80, 80 and follows the contour of the sprocket around the curved portion of shelf 112 as shown and described with reference to the shelf 88 at the opposite end of the machine and as referred to previously with reference to FIG. 3 and FIG. 4.

Figure 12:
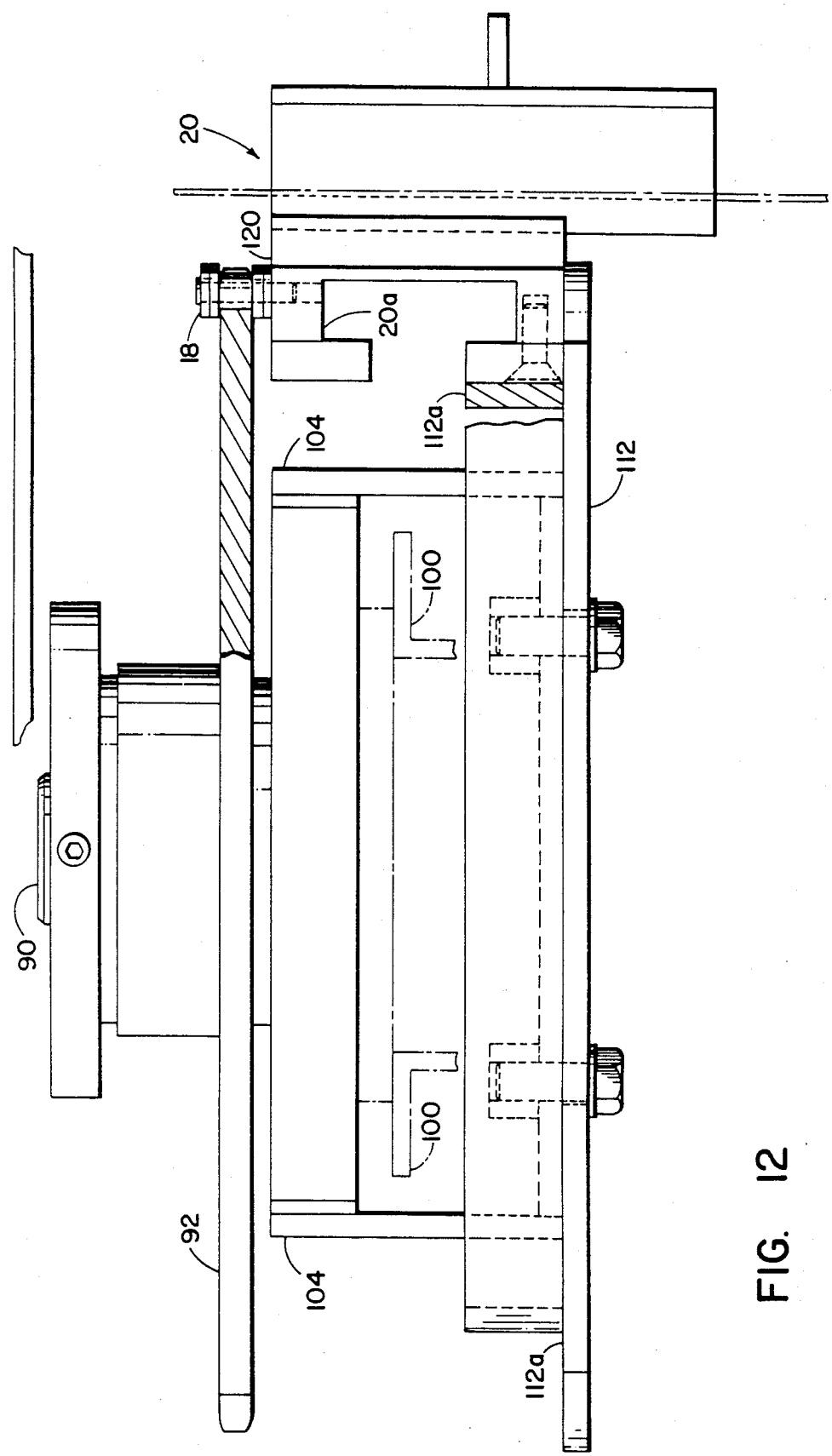
FIG. 12 is a vertical section taken generally on the line 12—12 of FIG. 7.

FIGS. 11 and 12 illustrate this shelf 112 in greater detail, and these views also illustrate to best advantage the configuration for the chain 18 and the coupling means between the chain and the clamp assembly 20. The conveyor 18 is of conventional configuration having interconnected roller links with pins 18a extending through the connecting parts of the roller link and the roller link itself. The significant difference between the chain 18 and a conventional roller chain is that each pin 18a extends downwardly below the lower marginal edge of the chain 18 and is received in an upwardly open cavity in the clamp assembly 20 so as to move the clamp assembly 20 in the direction of motion of the chain, at least when the clamp assembly 20 is suitably supported so as not to fall away the chain as mentioned previously. The longitudinally extending tracks 80, 80 so support the clamp assemblies 20, 20 in that each such clamp assembly has a generally rectangular shaped cavity 20a for slidably receiving the generally rectangular track 80. As each clamp assembly moves around the 180 degree turn at each end of the machine, from one straight run to the other straight run, these clamp assemblies 20 are supported on a shelf such as that illustrated at 112 in FIG. 11 and FIG. 12 and the depending pins 18a of the chain conveyor 18 continue moving these clamp assemblies over these support shelves. Thus, the coupling means provided between the chain 18 and each clamp assembly 20 comprises depending pins 18a in the roller chain to be received in upwardly open recesses defined for this purpose in the slide block portion 20a of the clamp assembly 20.

From FIG. 11 it will be apparent that the shelf 112, for supporting the clamp assemblies as they move around the semicircular track at the idler sprocket end of the electroplating machine, is supported in the same support structure for slidably supporting the bearing assembly for the idler sprocket 92 and the chain 18. More particularly, sliding portion 96 referred to previously as being adjustably mounted for limited longitudinal movement in the machine frame also serves to support the shelf 112 and to thereby locate the vertically extending flange 112a against which the clamp assembly 20 rests as it is transported by the chain 18 and on the horizontally extending surface 112b of the shelf 112.

Figure 8:
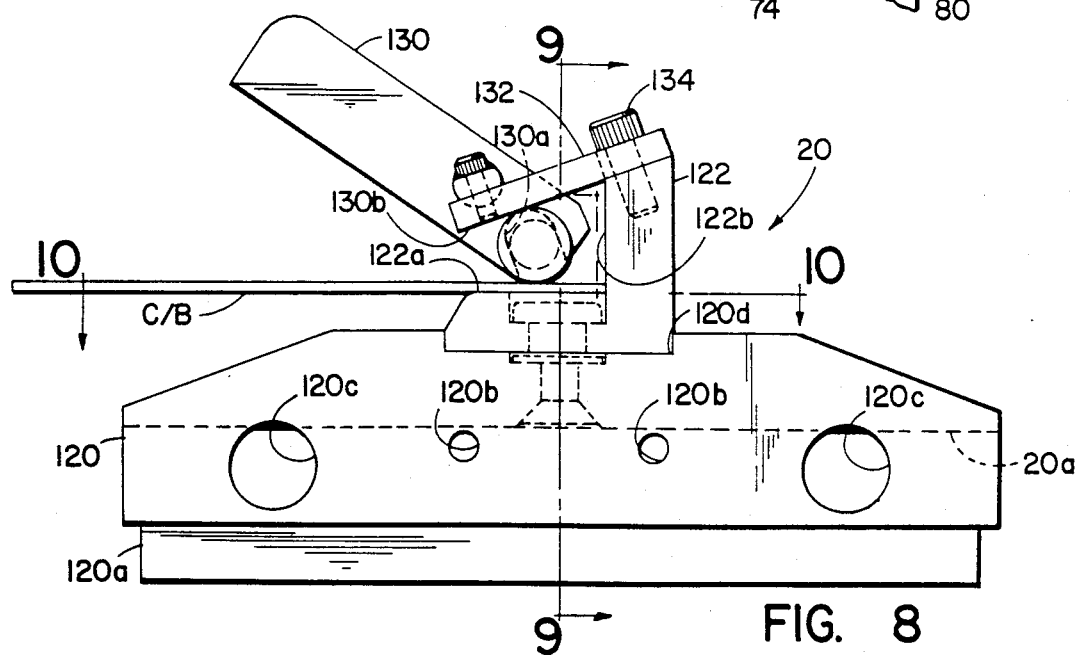
FIG. 8 is a top plan view of a single workpiece clamp assembly with a circuit board being illustrated in clamped relationship to an associated edge guide surface for the board.
Figure 9:
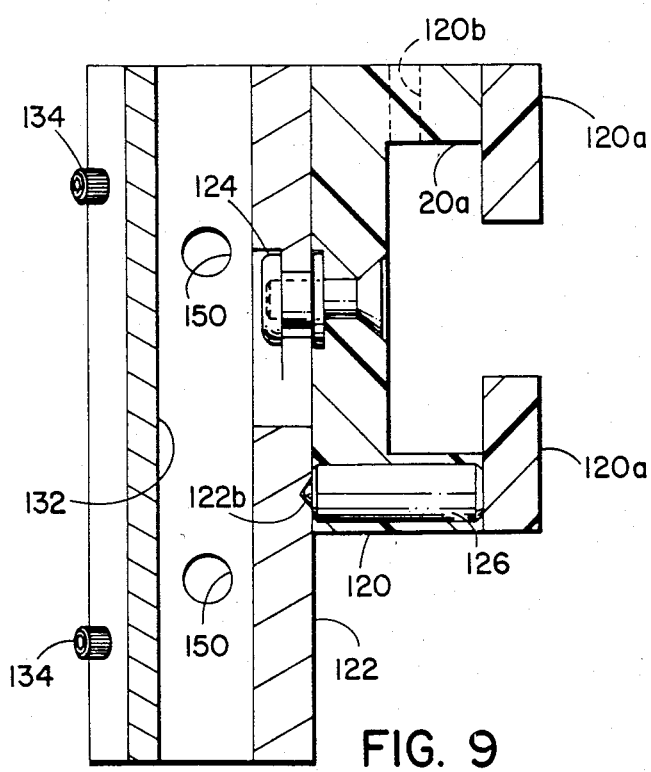
FIG. 9 is a sectional view taken generally on the line 9—9 of FIG. 8.

Turning now to a more detailed description of the clamp assemblies 20, 20 each such assembly is shown in FIGS. 8, 9, 10 and 13 as including a base portion defining the generally rectangular cavity 20a previously described for slidably receiving the fixed track 80. More particularly, this cavity 20a is defined in a plastic slide block 120, which slide block is generally U-shaped in vertical cross section as shown in FIG. 9 but which has vertically extending flange portions 120a and 120a secured thereto, as by welding or by fasteners or the like. The upper portion of slide block 120 defines upwardly open recesses 120b for receiving the depending pins 18a of the conveyor chain 18. Two such openings are provided in centered relationship of the slide block 120 as best shown in FIG. 8, and in order to allow the chain to move the clamp assembly 20 around the semi-circular paths provided at opposite ends of the machine enlarged openings 120c are provided for clearance purposes so that depending pins adjacent to those utilized in the openings 120b, 120b are free to move within these enlarged openings 120c and not to interfere with the semi-circular path taken by the clamp assembly 20 as it moves around the sprockets as suggested in FIGS. 3 and 7 at the ends of the machine.

Figure 10:
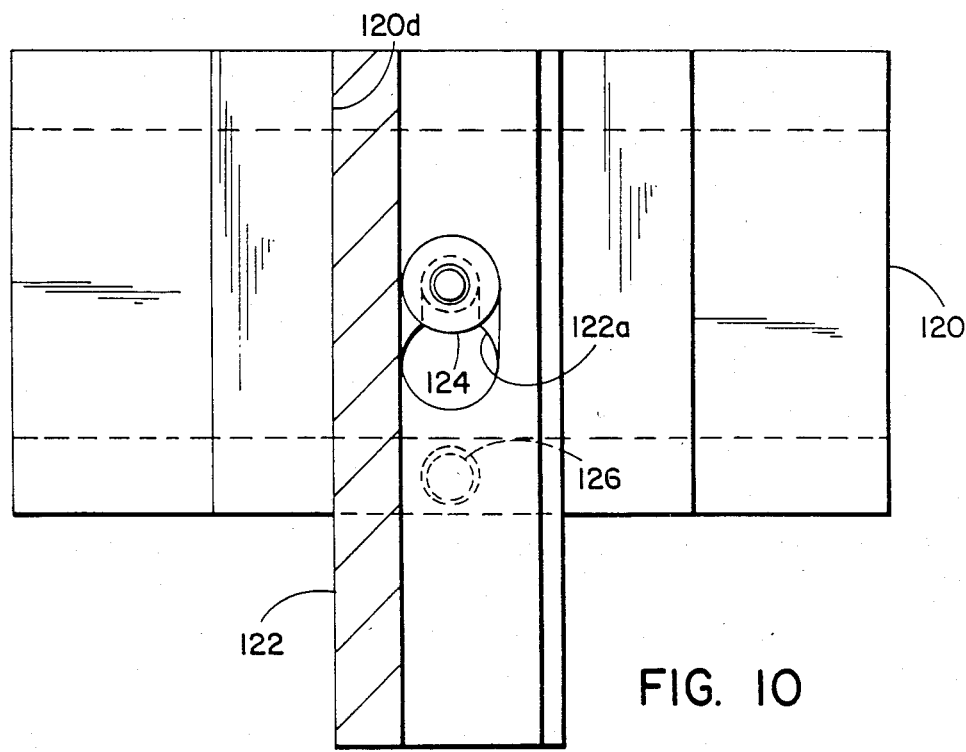
FIG. 10 is a sectional view taken on the line 10—10 of FIG. 8.

Still with reference to the base portion of the clamp assembly 20 FIG. 10 shows a vertically elongated clamp body 122 removably secured to the slide block 120 and more specifically, this clamp body 122 is located in a vertically extending groove 120d in the slide block 120. A bayonet connection secures clamp body 122 to slide block 120 and is defined by a key-hole slot 122a defined in the clamp body 122 and a stud 124 provided in the slide block 120. As so constructed and arranged the clamp body 122 can be moved vertically and withdrawn from the slide block 120 in the event that complete removal of the entire clamp assembly 20 is not necessary for any reason—that is, in situations where reworking or replacement of the circuit board clamping mechanism itself is necessary for some reason. A spring loaded plunger assembly 126 is provided in the lower leg of the slide block 120 for engaging a detent provided for this purpose in the clamp body 122 to increase the holding force achieved by the bayonet connection referred to previously. The slide block 120 is preferably fabricated from a plastic material and the vertically elongated clamp body 122 is of metal, such as stainless steel or aluminum. Thus, the detent 122b in the rear face of the clamp body 122 serves to anchor the clamp body 122 and the slide block 120 together for movement as a secure unit.

The clamp body 122 is of generally L-shaped configuration as seen in horizontal section, see FIG. 8, and the forwardly extending leg carries a clamp plate 132 which clamp plate pivotably supports a lever 130 and roller 140 to be described. Two screws 134, 134 secure clamp plate 132 to body 122.

Still with reference to FIGS. 8, 9, 10 and 13 each workpiece clamp assembly 20 includes a clamping portion in the form of lever 130, which lever is pivotably connected to the clamp body described above, and more particularly is pivotally connected to the clamp plate 132 by bar 146.

As so constructed and arranged the clamp body 122 and clamp plate 132 cooperate to define a guide surface for receiving the circuit board as best shown in FIG. 8. More particularly, this guide surface includes a vertically extending surface 122a for engaging the circuit board face, and a surface 122b forming a corner with the surface 122a for locating the leading edge of the circuit board C/B so that the board can be transported around the electroplating machine described previously. The circuit board C/B is held against the above described guide surface or surfaces by vertically elongated roller member 140, and the roller 140 is coupled to the lever 130 so that counterclockwise movement of the lever 130 (in FIG. 8) will move the elongated roller 140 away from the circuit board C/B and away from the guide surface 122a of the clamp body. More particularly, the coupling between elongated member 140 and lever 130 comprises an inwardly open slot defined by the inner end of the lever 130 and designated generally by reference 130a in FIG. 8. The sides of the slot 130a in the lever 130 are inclined with respect to the direction of the line of action for two compression springs 150, 150 acting between the forwardly projecting leg of clamp body 122 and the elongated roller 140 as suggested in FIG. 13. As so constructed and arranged these springs 150, 150 urge the elongated roller member 140 into contact with the inwardly facing ramp surface 130b of the clamp plate 132 to urge the elongated member 140 against the circuit board C/B to hold the board in clamp assembly 20. It will be apparent that these springs 150, 150 engage recessed areas 142, 142 of the roller 140 so that the roller is free to rotate and to thereby facilitate entry of the circuit board into a clamped position in the clamp assembly defined by the engagement normally present between elongated member 140 and surface 122a of the clamp body. As the board is inserted into the position shown for it in FIG. 8 the roller will be turned in a counterclockwise direction slightly as a result of knurled end portions 144 acting on the surface of the circuit boards C/B and the roller will move relative to the ramp surface 130b of the clamp plate 132 during loading of the board in the clamp assembly. Once the board has been so inserted normal spring pressure from the compression springs 150, 150 will secure the board in place and the angle of the ramp surface 130b will assure that the board is not inadvertently pulled free of its clamp assembly as it traverses the path described previously. That is, the board will move through the dams provided at the upstream and downstream ends of the plating and treating tanks in the machine and any force exerted by these dams on the board will not tend to pull the circuit board from the clamp body. The configuration for the clamp body is such that the circuit board is securely held in place against the guide surface 122a and 122b as the clamp assemblies are moved around the closed path defined for them by the conveyor chain 18.

Figure 13:
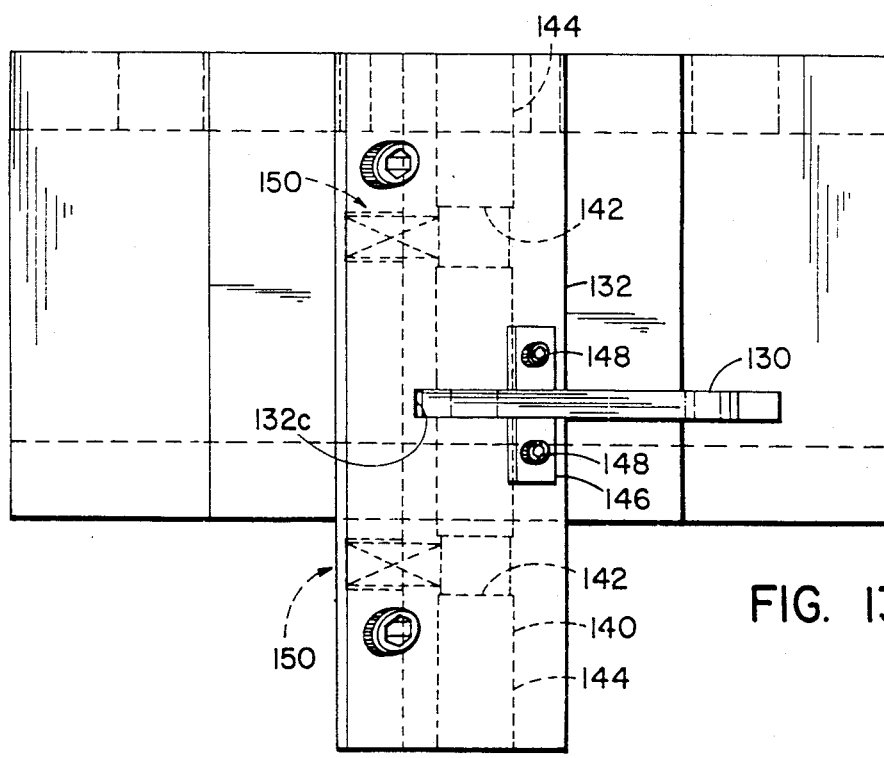
FIG. 13 is a front elevation of the clamp shown in FIGS. 8-12.

As mentioned previously the lever 130 is pivotally mounted on the clamp body plate 132 and this is accomplished by providing a through opening in the lever 130 and providing a short axle part or bar 146 which extend through the hole in lever 130 and is secured to the clamp plate 132 by screws 148, 148. The lever 130 extends through a slot provided for this purpose in the clamp plate 132 and such slot is indicated generally at 132c in FIG. 13. FIGS. 8 and 13 show the lever 130 and its coupling connection to the roller 140.

I claim:

1. A plating machine having an electrolytic solution and electrode means for plating marginal lower edge portions of flat planar workpieces comprising:
   a machine frame including a base having various rinsing and plating stations, including an elongated superstructure spaced above said base,
   a workpiece transport conveyor having a chain and at least two sprockets supported in opposite ends of said superstructure for rotation on vertical axes so that said chain moves in a closed path defined by generally parallel straight runs and generally semicircular end turns,
   elongated tracks supported in said superstructure adjacent and parallel said straight chain runs,
   a plurality of workpiece clamp assemblies slidably received on said tracks, and each assembly having a clamping portion and a base portion,
   said chain having individual roller links connected to one another by conventional means, and having rollers supported on vertically extending pins, at least some of said pins having projecting portions which are received in pin openings provided in said clamp assembly base portions to connect said clamp assembly base portions to said chain at spaced locations thereon, and
   clamp assembly support means located at the ends of said superstructure, at least one such support means being movable from an active position to support said clamp assemblies as they move around a sprocket to an inactive position such that said clamp assemblies can be removed or replaced to vary the spacing of said clamp assemblies on said chain.

2. The combination of claim 1 wherein each clamp assembly base portion comprises a slide block defining a channel for slidably receiving said track, and a clamp body removably secured to said slide block.

3. The combination of claim 2 wherein each clamp assembly clamping portion comprises a lever pivotally mounted in said clamp body, a vertically elongated member coupled to said lever for movement toward and away from a vertically elongated workpiece edge guide surface defined by said clamp body, and biasing means to urge said member toward said workpiece guide surface and thereby clamp a workpiece therebetween and in fixed relationship to said vertically extending guide surface.

4. The combination of claim 3 wherein said clamp body includes a vertically elongated clamp plate spaced from said workpiece edge guide surface and inclined with respect to said surface, and said biasing means comprising compression springs acting on said elongated member to urge said member into contact with said clamp plate, which inclined plate defines a ramp surface adapted to act on said member to cooperate with said springs in urging said member toward said guide surface.

5. The combination of claim 4 wherein said clamp body defines a vertically extending corner to receive a marginal side edge of a workpiece to locate the workpiece in predetermined relationship to said tracks and to said chain for transport through the various rinsing and plating stations, said lever pivotally mounted to said clamp plate for movement on a vertical axis and said vertically elongated member coupled to a slotted inner end of said lever, said slotted inner end of said lever slidably receiving a midportion of said elongated member and the slot sides of the slotted lever end being inclined with respect to the direction of the force of said springs.

6. The combination of claim 1 wherein said clamp assembly support means comprises arcuately shaped clamp base support shelves located vertically below said sprockets at the ends of said superstructure, at least one such shelf being movable from an active position to so support said clamp assemblies as they move around such sprocket to an inactive position which permits removal of the clamp assemblies.

7. In a plating machine which includes a frame for supporting the various rinsing and plating tanks required for treating and plating depending portions of planar workpieces, and which includes a transport conveyor movable horizontally along a predetermined path between a load and an unload station, and electrode means associated with an electrolytic solution at a plating station in said machine, the improvement comprising workpiece clamping assemblies coupled to the transport conveyor, each such assembly including a base portion connected to the conveyor and a workpiece clamping portion movably mounted to the base portion and adapted to clamp a workpiece therebetween by gripping a vertical edge portion of the workpiece, said base portion including a vertically elongated clamp body defining a vertically elongated marginal edge guide surface for locating the workpiece during its movement along the path, said clamping portion including a lever pivotally mounted in said clamp body, a vertically elongated member coupled to said lever for movement toward and away from said vertically elongated edge guide surface, biasing means to urge said member toward said guide surface, said biasing means including compression springs acting on said member and said clamp body defining a ramp surface to engage said elongated member and cooperate with said springs in urging said member toward said guide surface.

8. The combination of claim 7 wherein said clamp body has a clamp plate secured thereto and supporting said elongated member between an inclined ramp surface and said guide surface, said lever pivotally mounted to said clamp plate for movement on a vertical axis and having an inner end coupled to said elongated member.

9. The combination of claim 8 wherein said lever inner end is slotted to slidably receive a midportion of said elongated member, and the sides of said slot sides of said lever inner end being inclined with respect to the direction of the line of action for said springs.

10. The combination of claim 6 wherein said clamp assembly base portion includes a slide block adapted to move along a track or rail associated with the transport conveyor, and upwardly open recesses in said slide block to receive depending lugs or pins in said transport conveyor to cause movement of the clamp assemblies along the track in response to movement of the conveyor.

11. The combination of claim 10 wherein said clamp body is removably secured to said slide block, and slide block having a vertically extending slot defined therein to receive said clamp body, and a projecting stud provided in said slide block and having a head portion so that said stud can be received in a key-shaped slot defined in said clamp body to secure said clamp body to said slide block without fasteners of the type requiring tools to release the clamp body from said slide block.

12. The combination of claim 11 further characterized by a spring loaded plunger and associated detent provided in said slide block and clamp body respectively to further assist in securing said body to said block.

* * * * *